(12) United States Patent
Painter et al.

(10) Patent No.: US 10,759,656 B2
(45) Date of Patent: Sep. 1, 2020

(54) MEMS SENSOR WITH DUAL PENDULOUS PROOF MASSES

(71) Applicant: Apple Inc., Cupertino, CA (US)

(72) Inventors: Christopher C. Painter, Dublin, CA (US); Te Hsi Lee, San Jose, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 15/721,643

(22) Filed: Sep. 29, 2017

(65) Prior Publication Data

US 2019/0100426 A1   Apr. 4, 2019

(51) Int. Cl.
| | |
|---|---|
| *G01P 15/125* | (2006.01) |
| *G01P 15/08* | (2006.01) |
| *B81B 3/00* | (2006.01) |

(52) U.S. Cl.
CPC ......... *B81B 3/0086* (2013.01); *B81B 3/0097* (2013.01); *G01P 15/125* (2013.01); *B81B 2201/0235* (2013.01); *B81B 2203/01* (2013.01); *B81B 2203/0181* (2013.01); *B81B 2203/04* (2013.01); *G01P 2015/0831* (2013.01); *G01P 2015/0837* (2013.01)

(58) Field of Classification Search
CPC ........ G01P 15/125; G01P 15/08; G01P 15/18; G01P 15/0802; G01P 2015/0831; G01P 2015/0837
See application file for complete search history.

(56) References Cited

U.S. PATENT DOCUMENTS

| | | | |
|---|---|---|---|
| 6,230,566 B1 | 5/2001 | Lee et al. | |
| 6,301,965 B1 | 10/2001 | Chu et al. | |
| 7,971,483 B2 | 7/2011 | Supino et al. | |
| 8,806,940 B2* | 8/2014 | Classen | G01P 15/0802 |
| | | | 73/514.29 |
| 8,973,439 B1 | 3/2015 | Baldasarre et al. | |
| 9,229,026 B2* | 1/2016 | Stewart | G01P 15/131 |
| 9,661,411 B1 | 5/2017 | Han et al. | |
| 2008/0314147 A1* | 12/2008 | Nasiri | G01P 15/125 |
| | | | 73/514.32 |
| 2010/0011860 A1* | 1/2010 | Offenberg | G01P 15/125 |
| | | | 73/514.32 |
| 2010/0107762 A1* | 5/2010 | Classen | G01P 15/0802 |
| | | | 73/514.24 |
| 2010/0175473 A1* | 7/2010 | Classen | G01P 15/125 |
| | | | 73/514.29 |

(Continued)

OTHER PUBLICATIONS

Classen et al., "Advanced Surface Micromachining Process—A First Step Towards 3D MEMS", MEMS, 314-318, 2017.
Nagel et al., "Characterization of temperature gradients on MEMS acceleration sensors", Procedia Engineering, 4 pages, 2016.

*Primary Examiner* — Helen C Kwok
(74) *Attorney, Agent, or Firm* — Fish & Richardson P.C.

(57) ABSTRACT

A MEMS sensor is disclosed that includes dual pendulous proof masses comprised of sections of different thickness to allow simultaneous suppression of vertical and lateral thermal gradient-induced offsets in a MEMS sensor while still allowing for the normal operation of the accelerometer. In an embodiment, the structure and different sections of the MEMS sensor is realized using multiple polysilicon layers. In other embodiments, the structure and different thickness sections may be realized with other materials and processes. For example, plating, etching, or silicon-on-nothing (SON) processing.

12 Claims, 10 Drawing Sheets

(56) References Cited

U.S. PATENT DOCUMENTS

| | | | |
|---|---|---|---|
| 2010/0300204 A1* | 12/2010 | Reinmuth | G01P 15/125 73/514.32 |
| 2012/0017681 A1* | 1/2012 | Reinmuth | G01P 15/125 73/514.35 |
| 2012/0186347 A1* | 7/2012 | McNeil | G01P 15/125 73/514.32 |
| 2012/0227494 A1* | 9/2012 | Yosida | G01P 15/0802 73/514.32 |
| 2013/0192362 A1* | 8/2013 | Rytkonen | G01P 15/08 73/504.08 |
| 2013/0192364 A1* | 8/2013 | Acar | G01C 19/5733 73/504.12 |
| 2014/0069190 A1* | 3/2014 | Tanaka | G01P 15/125 73/514.32 |
| 2014/0208849 A1* | 7/2014 | Zhang | G01P 15/125 73/514.32 |
| 2014/0251011 A1* | 9/2014 | Zhang | G01P 15/125 73/514.32 |
| 2014/0283605 A1* | 9/2014 | Baldasarre | G01P 15/125 73/514.32 |
| 2015/0096378 A1* | 4/2015 | Kigure | G01P 15/125 73/514.32 |
| 2015/0241466 A1* | 8/2015 | Tanaka | G01P 15/125 73/514.32 |
| 2018/0246141 A1* | 8/2018 | Taketani | G01P 15/125 |
| 2019/0025056 A1* | 1/2019 | Hughes | G01C 19/5712 |

* cited by examiner

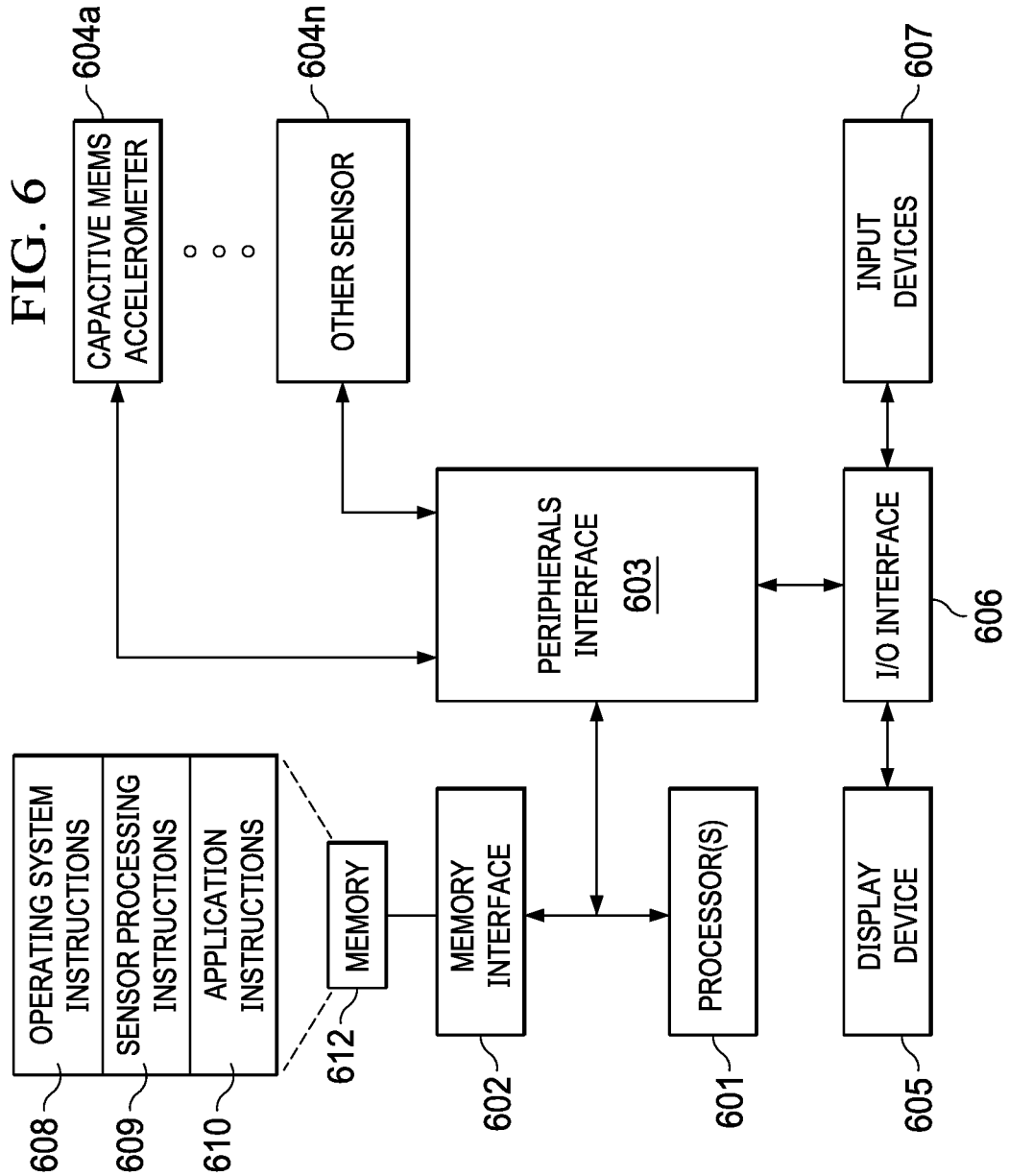

MEMS SENSOR WITH DUAL PENDULOUS PROOF MASSES

TECHNICAL FIELD

This disclosure relates generally to capacitive microelectromechanical systems (MEMS) sensors.

BACKGROUND

The offset performance of capacitive MEMS accelerometers is degraded in the presence of high thermal gradients as a result of the Knudsen effect on the proof mass. High thermal gradients arise from proximity to high temperature components on a printed circuit board (PCB), such as a system-on-chip (SOC). The thermal gradient results in deflection of the proof mass from its initial position when at rest, thus creating an offset in the sensor output. This performance issue limits the placement options of the MEMS sensor inside a system (e.g., inside a smartphone). Solutions have been proposed that use a proof mass fabricated using multiple polysilicon structural layers with perforations to suppress offsets induced by vertical thermal gradients. These solutions, however, do not address offsets caused by lateral thermal gradients.

SUMMARY

A MEMS sensor is disclosed that includes dual pendulous proof masses comprised of sections of different thickness to allow simultaneous suppression of vertical and lateral thermal gradient-induced offsets in a MEMS sensor while still allowing for the normal operation of the accelerometer. In an embodiment, the structure and different sections of the MEMS sensor is realized using multiple polysilicon layers. In other embodiments, the structure and different thickness sections may be realized with other materials and processes. For example, plating, etching, or silicon-on-nothing (SON) processing.

In an embodiment, a micro-electromechanical systems (MEMS) sensor, comprising: a substrate; a first electrode and a second electrode having a first polarity disposed on, or formed in, the substrate; a third electrode and fourth electrode having a second polarity opposite the first polarity, disposed on, or formed in the substrate; an anchor disposed on the substrate; a first pendulous mass rotatably coupled to the anchor, the first pendulous mass having a heavy side and a light side, the heavy side having more mass then the light side, the first pendulous mass serving as a first common electrode and positioned to form a first gap between the mass and the first electrode and a second gap between the mass and the second electrode, the first pendulous mass configured to rotate about the anchor in a first direction when the first pendulous mass is subjected to an acceleration force; and a second pendulous mass rotatably coupled to the anchor, the second pendulous mass having a heavy side and a light side, the heavy side having more mass then the light side, the second pendulous mass serving as a second common electrode positioned to form a third gap between the mass and the third electrode and a fourth gap between the mass and the fourth electrode, the second pendulous mass configured to rotate about the anchor in a second direction that is opposite the first direction when the second pendulous mass is subjected to the acceleration force.

In an embodiment, an electronic system comprises: a micro-electromechanical systems (MEMS) sensor configured to sense acceleration of the electronic system, the MEMS sensor including dual pendulous masses having sections of different thickness and a readout circuit configured to: convert a change in differential capacitance between electrodes of the MEMS sensor to differential voltage signals; process the differential voltage signals to remove lateral, thermal gradient-induced offset; and calculate acceleration data based on the processed differential voltage signals; one or more processors; memory coupled to the one or more processors and storing instructions that when executed by the one or more processors, cause the one or more processors to perform operations comprising: obtaining the acceleration data; calculating a location of the electronic system using the acceleration data; and displaying the location on a display device of the electronic system.

Particular implementations disclosed herein provide one or more of the following advantages. The dual pendulous design disclosed herein allows for suppression of lateral, thermal gradient-induced offset by ensuring that forces caused by the lateral thermal gradient act on the dual pendulous proof masses in common mode to allow electronic cancellation of the offset. At the same time, the sections of different thickness allow for cancellation of the vertical gradient forces while still allowing for the normal operation of the accelerometer.

The details of the disclosed implementations are set forth in the accompanying drawings and the description below. Other features, objects and advantages are apparent from the description, drawings and claims.

DESCRIPTION OF DRAWINGS

FIG. 6 is an architecture for an electronic system that uses a capacitive MEMS accelerometer with dual pendulous proof masses for various applications, according to an embodiment.

The same reference symbol used in various drawings indicates like elements.

DETAILED DESCRIPTION

Overview

A typical MEMS accelerometer is composed of a movable proof mass that serves as a common electrode to fixed outer plate electrodes. The movable mass electrode and fixed outer plates represent capacitors. The deflection of the proof mass is measured using the capacitance difference.

When a MEMS sensor package (e.g., a MEMS accelerometer sensor package) is proximate to external high temperature components on a PCB, such as from a nearby SOC, vertical and lateral thermal gradients can arise within the sensor cavity housing the proof mass, which is typically filled with a gas (e.g., nitrogen). The vertical thermal gradient extends in the vertical direction (e.g., Z+). The gas below the proof mass will tend to have a higher temperature than the gas above the proof mass, since the gas below the proof mass is closer to the heat source or the thermally conductive copper layers of the PCB that conduct the heat. The vertical thermal gradient creates areas of higher or lower mean velocity of gas molecules in the sensor cavity, above and below the proof mass, respectively. This disparity of mean velocity of gas molecules causes a higher force of pressure on the proof mass from the hot side (below the proof mass) that causes the proof mass to deflect from its initial position, resulting in an accelerometer offset. This temperature effect is referred to as the Knudsen Effect or Crookes Radiometer. These forces are related to the area of the proof mass, whereas the sensitivity to acceleration forces is related to the mass of the proof mass.

To address vertical thermal gradient-induced offset, in an embodiment, the proof mass can be fabricated to have a heavy side and a light side, where the heavy side has more mass and therefore generates a higher moment than the light side under acceleration forces. The heavy side and light side can be fabricated using multiple layers of polysilicon. Balancing the pressure force on the light side with the pressure force on the heavy side can compensate for the vertical, thermal gradient-induced offset. This can be accomplished by adjusting the holes in the polysilicon layers to adjust the pressure force on the light side. Since the force pressure $F_P$ is proportional to the product of pressure P times area A ($F_P$=PA), the number and size of perforations in the proof mass can increase or decrease the pressure force through increasing or decreasing the surface area A of the proof mass that is subjected to pressure due to gas molecule collisions.

Additionally, hole size can be adjusted on the heavy side to compensate damping changes. While adjusting the hole quantity and hole size can reduce vertical, thermal gradient-induced offset, this approach cannot reduce lateral (in x-y plane), thermal gradient-induced offset because the thermal gradients are different on opposite sides of the proof mass.

Figure 1A:
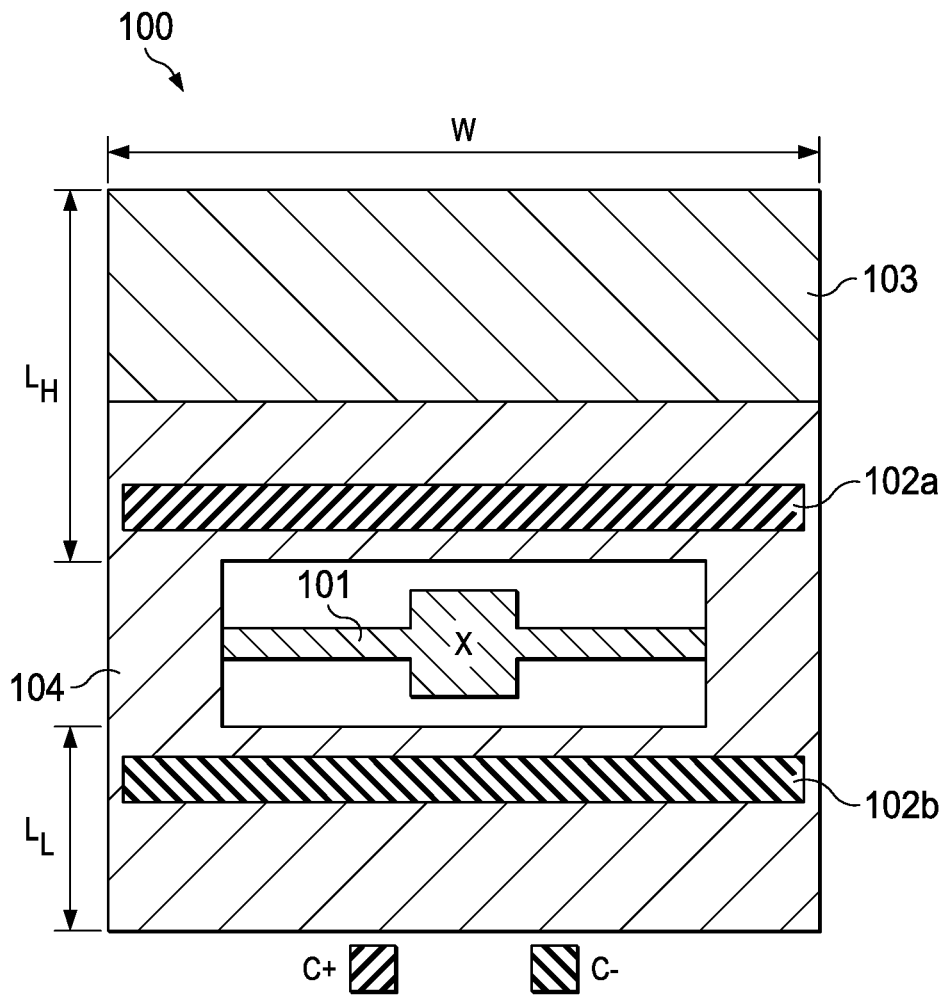
FIGS. 1A and 1B illustrate a conventional MEMS accelerometer that depends on mass asymmetry and includes a proof mass with a heavy side fabricated using a second polysilicon layer.
Figure 1B:
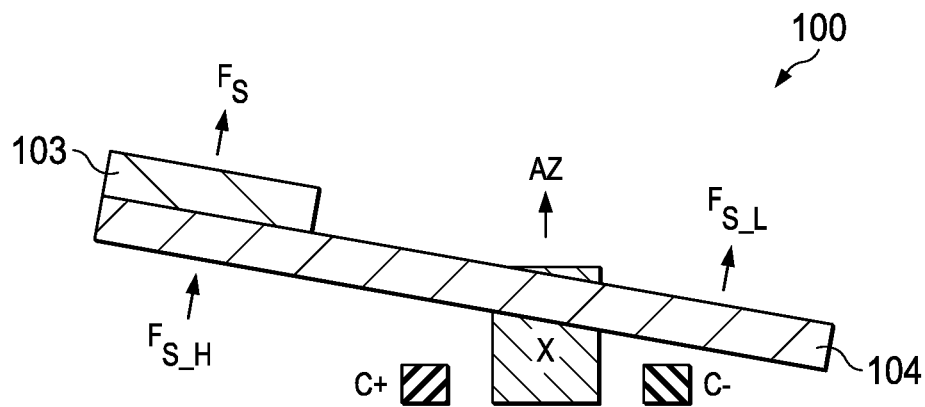

FIGS. 1A and 1B illustrate a conventional MEMS accelerometer structure 100 that depends on mass asymmetry and includes a heavy side that was fabricated using a second polysilicon layer. FIGS. 1A and 1B illustrate normal operation of structure 100 under acceleration. FIG. 1A shows a top view of structure 100 having a width w, light side length ($L_L$) and heavy side length ($L_H$). Structure 100 has additional mass m formed using a second polysilicon layer and torsion bar 101. Positive (C+) and negative (C−) electrodes 102a, 102b are also shown.

FIG. 1B shows a side view of structure 100 when in detection (sensing acceleration). The force $F_S$ exerted on the additional mass due to acceleration $A_Z$ is given by:

$$F_S = A_Z \cdot m. \quad [1]$$

The forces $F_{S\_H}$ and $F_{S\_L}$ exerted on heavy side 103 and light side 104, respectively, due to acceleration $A_Z$ are given by Equations [2] and [3]:

$$F_{S\_H} = A_Z \cdot L_H \cdot w \cdot t \cdot \rho, \quad [2]$$

$$F_{S\_L} = A_Z \cdot L_L \cdot w \cdot t \cdot \rho, \quad [3]$$

where t is the thickness and ρ is the density of the mass material (e.g., polysilicon). $A_Z$ is acceleration in the vertical (+Z direction), which in this example is the sensitive axis of the accelerometer.

The overturning moment or sensitivity $M_O$ of the structure 100 is given by Equation [4]:

$$M_0 \sim A_z \cdot \left[ w \cdot t \cdot \rho \left( \frac{1}{2} (L_H^2 - L_L^2) \right) \right] + F_s \cdot L_s, \quad [4]$$

where $L_s$ is the distance from the anchor to the center of mass m.

Figure 1C:
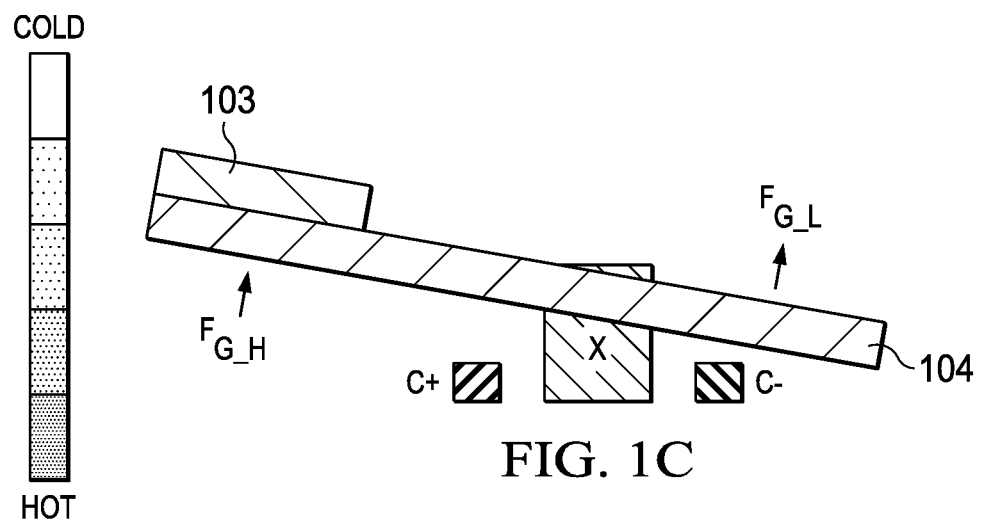
FIGS. 1C and 1D illustrate vertical and lateral thermal gradient sensitivity for the conventional MEMS accelerometer shown in FIGS. 1A and 1B.
Figure 1D:
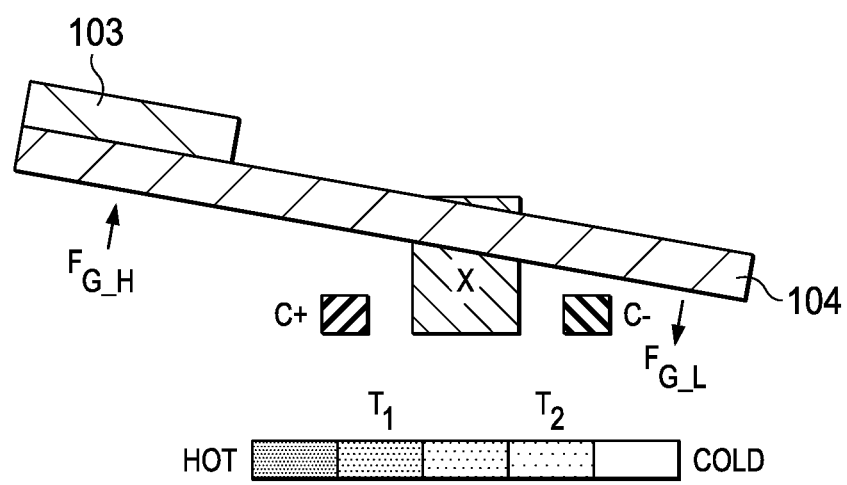

FIGS. 1C and 1D illustrate vertical and lateral gradient sensitivity for structure 100 shown in FIGS. 1A and 1B. A vertical thermal gradient sensitivity is illustrated in FIG. 1C. The forces exerted on heavy side 103 and light side 104 are given by Equations [5] and [6], respectively:

$$F_{G\_H} = a_0 \cdot \Delta T \cdot w \cdot L_H, \quad [5]$$

$$F_{G\_L} = a_0 \cdot \Delta T \cdot w \cdot L_L. \quad [6]$$

where ΔT is a temperature change and $a_0$ is a constant that depends on the gas properties (e.g., density and pressure).

The overturning moment/sensitivity $M_O$ for structure 100 is given by Equation [7]:

$$M_O \sim a_0 \cdot \Delta T \cdot w \cdot (L_H - L_L). \quad [7]$$

As shown by Equation [7], structure 100 requires area symmetry to suppress the offset due to the vertical thermal gradient. It is noted that the area of heavy side 103 ($w \cdot L_H$) and the area of low side 104 ($w \cdot L_L$) can be made the same and still preserve accelerometer performance due to the existence of the additional mass force $F_s$. It is further noted that if sections of structure 100 are made with different thicknesses (e.g., using multiple polysilicon layers), a lumped mass m can be realized, which allows for a design space where the vertical thermal gradient sensitivity can be suppressed while still allowing for sensitivity to input acceleration.

Referring to FIG. 1D, a lateral thermal gradient sensitivity is illustrated. The forces exerted on heavy side 103 and light side 104 of structure 100 are given by Equations [8] and [9]:

$$F_{G\_H} = a_0 \cdot (T_1 - T_a) \cdot w \cdot L_H, \quad [8]$$

$$F_{G\_L} = a_0 \cdot (T_2 - T_a) \cdot w \cdot L_L, \quad [9]$$

where $T_a$ is ambient temperature.

The overturning moment/sensitivity $M_O$ of structure 100 is given by Equation [10]:

$$M_O \sim a_0 \cdot w \cdot \frac{1}{2}[T_1 \cdot L_H^2 - T_2 \cdot L_L^2 - T_a(L_H^2 - L_L^2)]. \quad [10]$$

As shown in Equation [10], the offsets induced by the lateral thermal gradient effects cannot be addressed by area symmetry alone (e.g., $L_H=L_L$). Nor can the lateral gradient effects be addressed by using sections with different thicknesses (e.g., using multiple polysilicon layers).

Figure 1E:
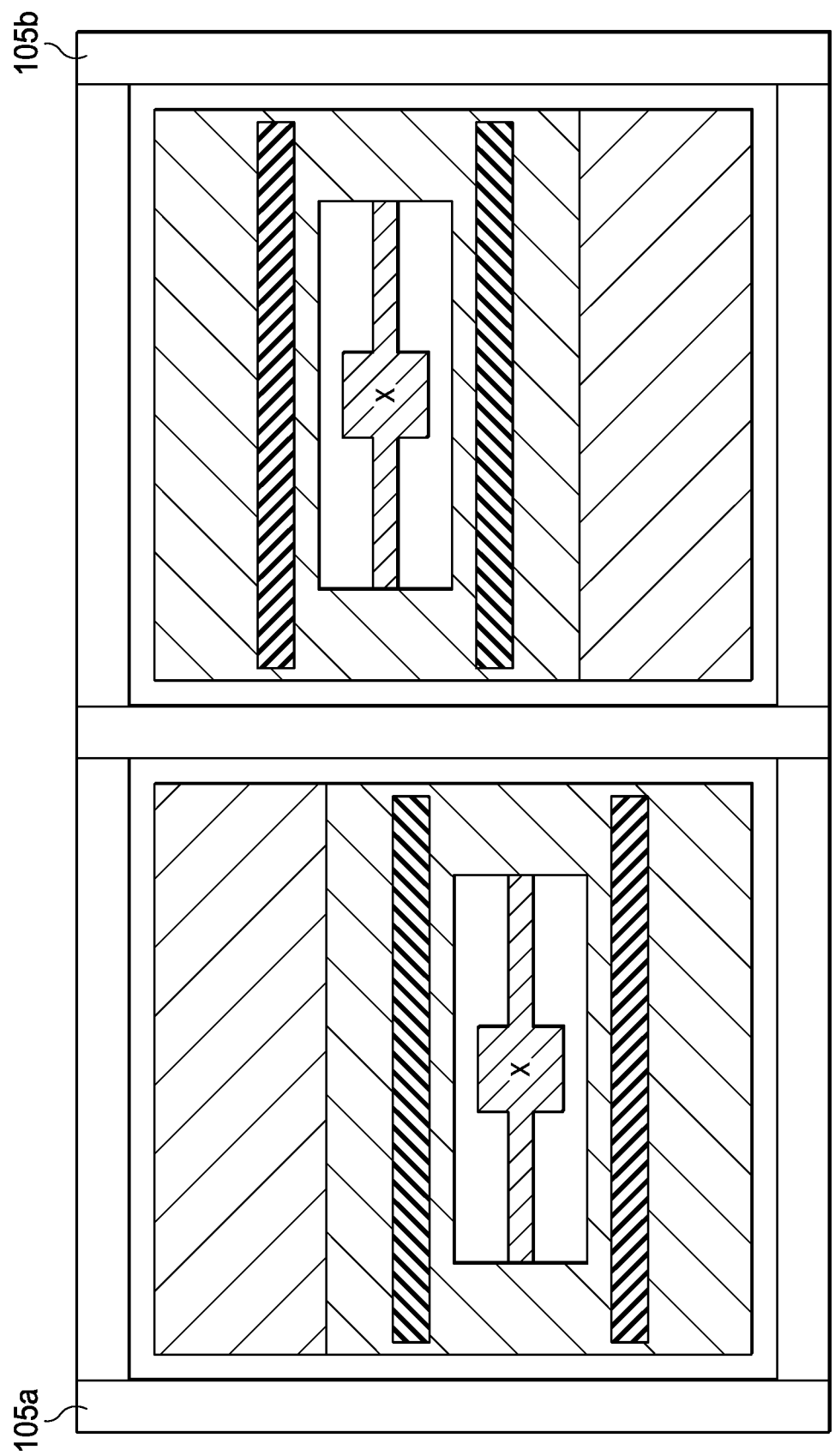
FIG. 1E illustrates a conventional MEMS accelerometer that uses two cells oriented 180° from each other.

FIG. 1E illustrates a conventional MEMS accelerometer that uses two cells 105a, 105b oriented 180° from each other. Although a two cell structured oriented 180° can be used to reduce the effects of vertical and lateral thermal gradients, the separation between cells 105a, 105b results in different local thermal gradients for cells 105a, 105b.

Figure 1F:
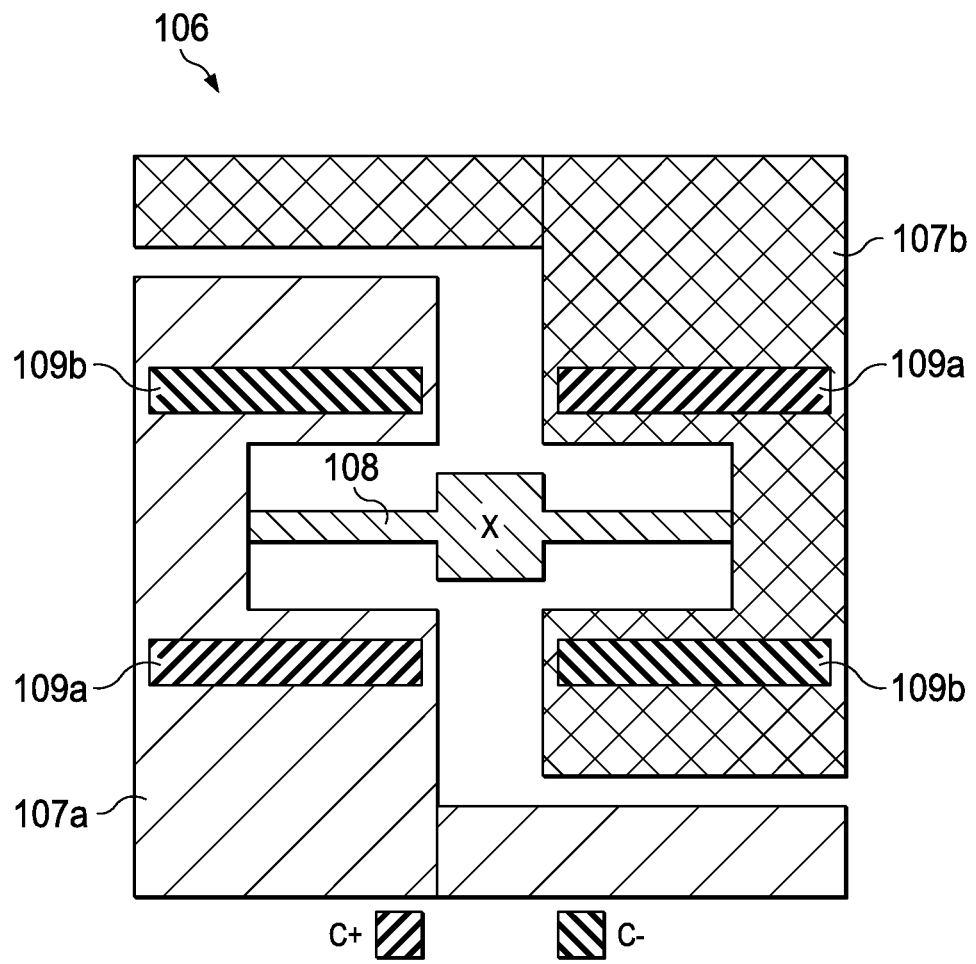
FIGS. 1F and 1G illustrate a conventional MEMS accelerometer that depends on differential masses fabricated from a single thickness layer.
Figure 1G:
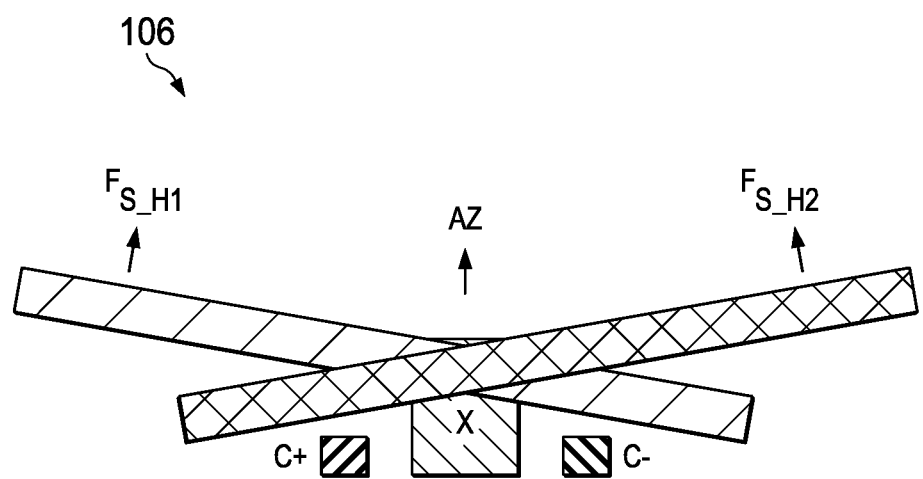

FIGS. 1F and 1G illustrate a conventional MEMS accelerometer structure 106 that depends on differential masses fabricated from a single thickness layer. FIGS. 1F and 1G illustrate normal operation of structure 106 under acceleration. The differential masses allow electronic cancellation of the lateral thermal gradient effect. FIG. 1F shows a top view of MEMS accelerometer structure 106 having differential masses 107a, 107b, where mass 107a has an area $A_{H1}$ and mass 107b has an area $A_{H2}$. Structure 106 also has torsion bar 108. Positive (C+) and negative (C-) electrodes 109a, 109b are also shown. FIG. 1G shows a side view of structure 106 when in detection (sensing acceleration). $A_Z$ is acceleration in the +Z direction, which in this example is the sensitive axis of the accelerometer. Note that the differential masses are fabricated from a single layer of silicon.

Referring to FIG. 1G, the net forces $F_{S\_H1}$ and $F_{S\_H2}$ exerted on the heavy side of the differential masses 107a, 107b due to acceleration $A_Z$ are given by Equations [11] and [12], respectively:

$$F_{S\_H1} = A_Z \cdot A_{H1} \cdot t \cdot \rho, \quad [11]$$

$$F_{S\_H2} = A_Z \cdot A_{H2} \cdot t \cdot \rho, \quad [12]$$

where $A_{H1}$ and $A_{H2}$ are the areas of the differential masses 107a, 107b, respectively.

Since the two masses are configured electronically for differential operation, the equivalent differential sensitivity $M_O$ of structure 106 is given by Equation [13]:

$$M_O \sim A_Z \cdot t \cdot \rho (A_{H1} \cdot L_{H1} + A_{H2} \cdot L_{H2}), \quad [13]$$

where $L_{H1}$ and $L_{H2}$ are the moment arms from the anchor to the center of mass of masses 107a, 107b, respectively. The sign change in sensitivity is because masses 107a, 107b work differentially.

Figure 1H:
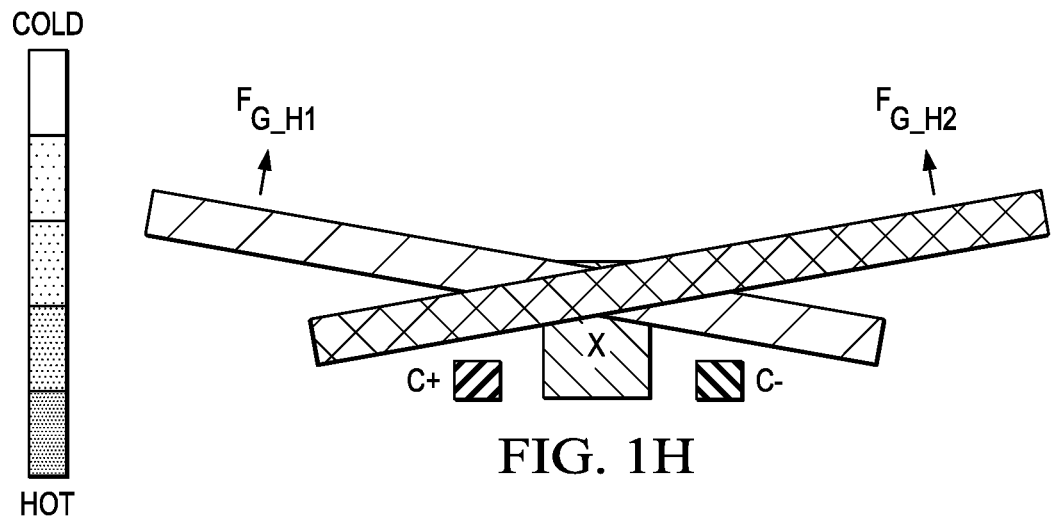
FIGS. 1H and 1I illustrate vertical and lateral thermal gradient sensitivity for the conventional MEMS accelerometer shown in FIGS. 1F and 1G.
Figure 1I:
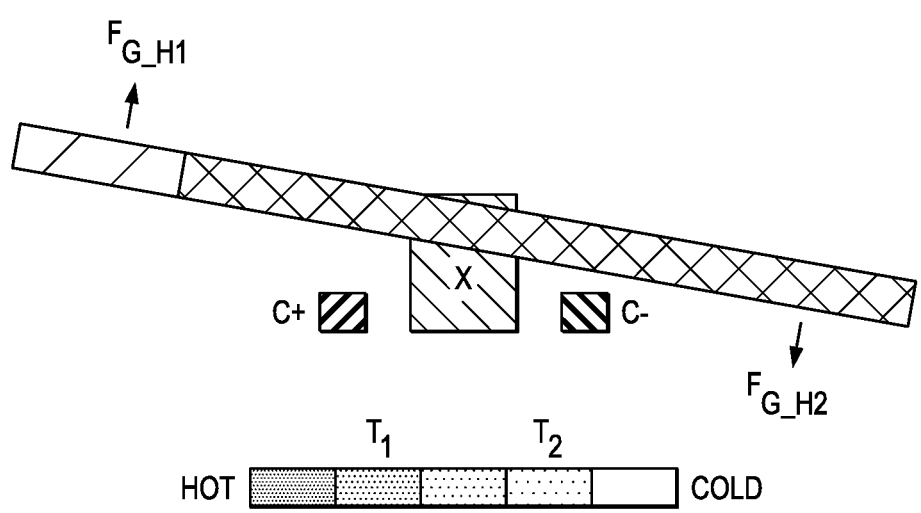

FIGS. 1H and 1I illustrate vertical and lateral thermal gradient sensitivities for structure 106 shown in FIGS. 1F and 1G. Referring to FIG. 1H, a vertical thermal gradient sensitivity is illustrated. The net forces on the heavy sides of the differential masses 107a, 107b are given by Equations [14] and [15]:

$$F_{G\_H1} = a_0 \cdot \Delta T \cdot A_{H1}, \quad [14]$$

$$F_{G\_H2} = a_0 \cdot \Delta T \cdot A_{H2}, \quad [15]$$

Again, due to the fact that the masses are configured for differential operation, the net equivalent differential sensitivity $M_O$ is given by Equation [16]:

$$M_O = a_0 \cdot \Delta T \cdot (A_{H1} \cdot L_{H1} + A_{H2} \cdot L_{H2}), \quad [16]$$

where $\Delta T$ is a temperature change and $a_0$ is a constant that depends on the gas properties (e.g., density and pressure). Sensitivity term $(A_{H1} \cdot L_{H1} + A_{H2} \cdot L_{H2})$ appears in both the vertical gradient sensitivity and the sensitivity under normal operation shown in Equation [13]. Therefore, the vertical gradient sensitivity cannot be made to be zero without also making the sensitivity under normal operation also equal to zero. Accordingly, MEMS accelerometer structures that have only a single thickness layer cannot be made to eliminate vertical gradient sensitivity without impacting performance.

Referring to FIG. 1I, a lateral temperature gradient sensitivity is illustrated. The net differential forces on differential masses 107a, 107b are given by Equations [17] and [18]:

$$F_{G\_H1} = a_0 \cdot (T_1 - T_a) \cdot A_{H1}, \quad [17]$$

$$F_{G\_H2} = a_0 (T_2 - T_a) \cdot A_{H2}, \quad [18]$$

where $T_1 < T_a < T_2$.

The net equivalent differential sensitivity is given by:

$$M_O = a_0 \cdot (T_1 - T_a) \cdot A_{H1} + a_0 \cdot (T_2 - T_a) \cdot A_{H2}. \quad [19]$$

Since $T_1 < T_a < T_2$, $(T_1 - T_a)$ and $(T_2 - T_a)$ are opposite signs and there is cancellation. As shown in Equation [19], the differential mass design allows for electronic cancellation of the lateral gradient effect.

Dual Pendulous Mass Design

Figure 2A:
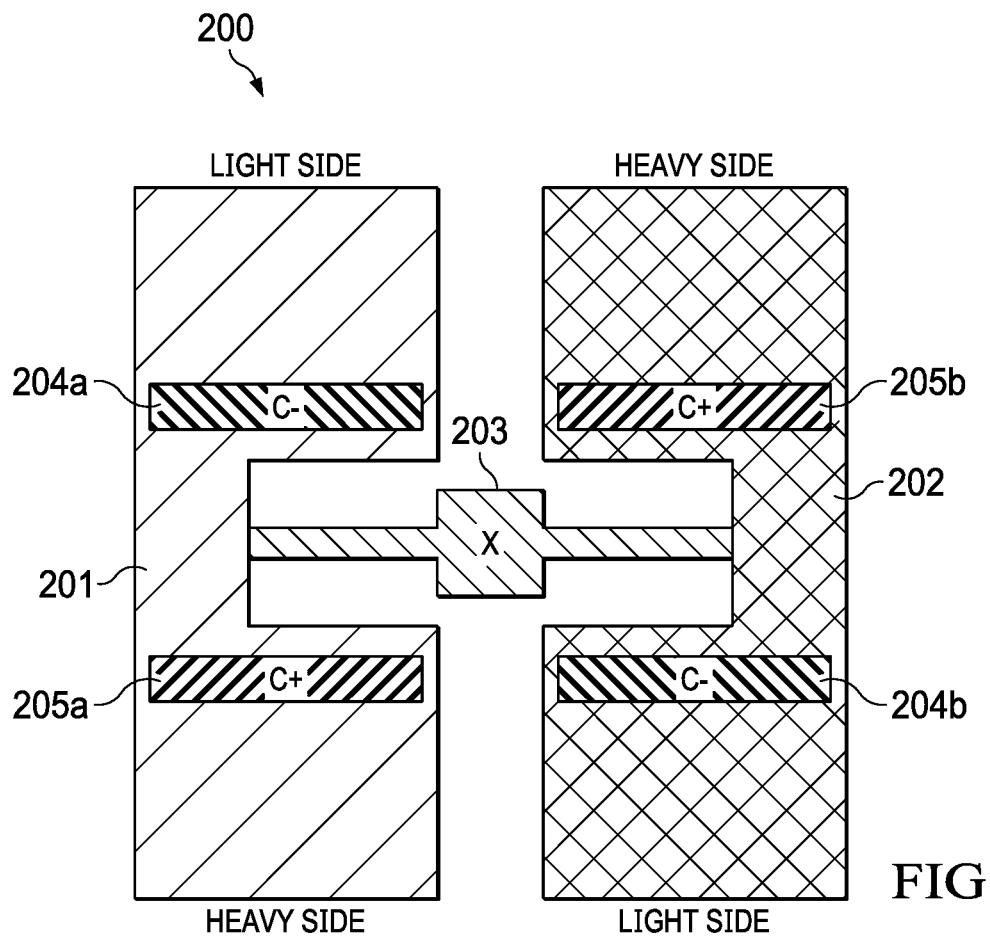
FIG. 2A is a top view of dual pendulous proof masses with multiple thickness layers, according to an embodiment.

FIG. 2A is a top view of dual pendulous masses 200 with multiple thickness layers, according to an embodiment. The structure shown in FIG. 2A is designed to overcome the shortcomings of the conventional MEMS accelerometer structures described above in reference to FIGS. 1A-1I.

A first pendulous mass 201 has a heavy side and a light side. A second pendulous mass 202 has a heavy side and a light side. The heavy sides of pendulous masses 201, 202 have more mass than the lighter sides of the masses 201, 202, and therefor generate higher moments than the lighter sides when subjected to an external acceleration. The pendulous masses 201, 202 are rotatably coupled to anchor 203 using, for example, torsion bars. Pendulous masses 201, 202 are not coupled together and therefore rotate independent of each other about anchor 203. Anchor 203 is attached to a substrate (e.g., substrate 104) in a MEMS sensor package (e.g., MEMS sensor package 100). Anchor 203 provides a fulcrum that allows the dual pendulous masses 201, 202 to "teeter-totter" in opposite directions in response to an external acceleration force.

Figure 2B:
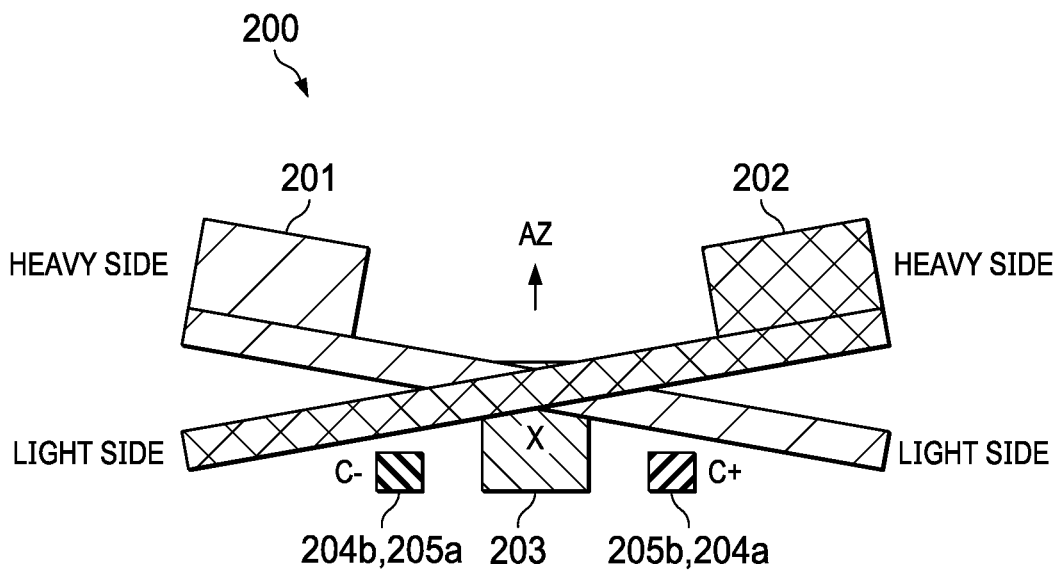
FIG. 2B is a side view of dual pendulous proof masses of FIG. 2A, according to an embodiment.

FIG. 2B is a side view of the dual pendulous masses 200 shown in FIG. 2A, according to an embodiment. As shown, when subjected to an external acceleration force ($A_{Z+}$), and due to the heavy/light sides, pendulous mass 201 pivots clockwise about anchor 203 (torsional movement), and at the same time, pendulous mass 202 pivots counterclockwise about anchor 203. As can be observed in FIG. 2B, when pendulous mass 201 pivots clockwise, mass 201 (a moving common electrode) becomes closer to fixed positive electrode 205a and further from fixed negative electrode 204a. Likewise, when pendulous mass 202 pivots counterclockwise, mass 202 (a moving common electrode) becomes closer to fixed positive electrode 205b and further from fixed negative electrode 204b. These pivots result in a change in differential capacitance, which can be extracted and processed by readout circuitry, as described in reference to FIG. 5.

Figure 3A:
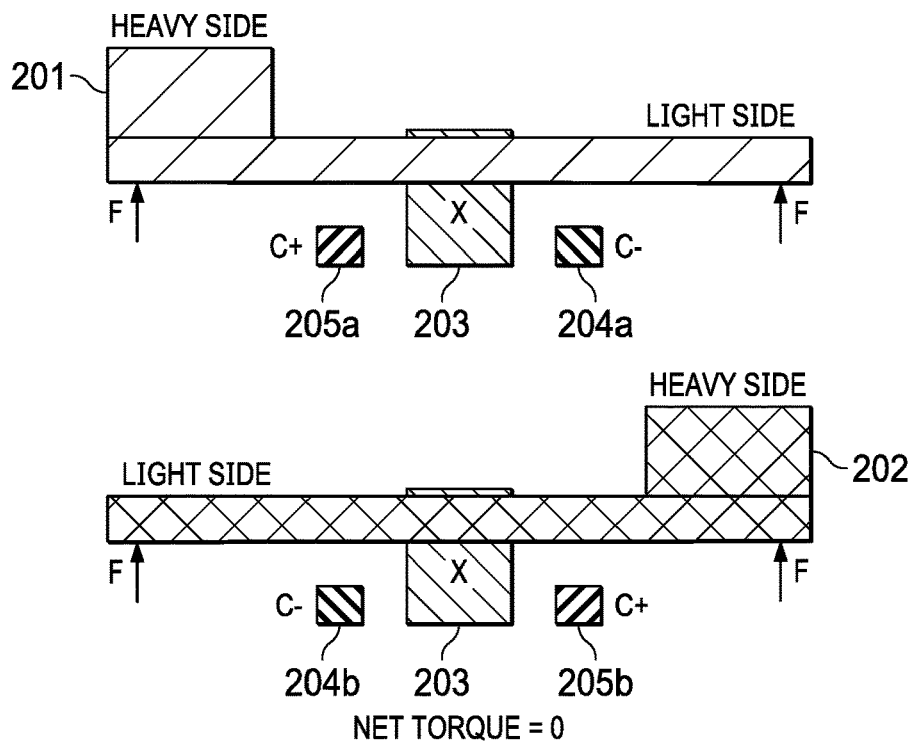
FIG. 3A is a side view of dual pendulous proof masses that use multiple polysilicon layers having perforations to suppress vertical, thermal gradient-induced offset, according to an embodiment.

FIG. 3A is a side view of dual pendulous proof masses that use multiple polysilicon layers having perforations to make the heavy side and light side areas symmetric and suppress vertical, thermal gradient-induced offset, according to an embodiment. As illustrated in FIG. 3A, the hole quantity and hole size in a polysilicon layer of the pendulous masses 201, 202 can be adjusted to balance dual pendulous masses 201, 202 by creating a net torque of zero on pendulous masses 201, 202. That is, the vertical component F of the pressure force caused by the vertical thermal gradient can be nullified by changing the area, by adjusting the hole quantity and hole size, exposed to the gas molecules in an amount sufficient to create a net torque of zero. The holes alone, however, cannot balance pressure force components $F_1$ and $F_2$ due to the lateral thermal gradient.

Figure 3B:
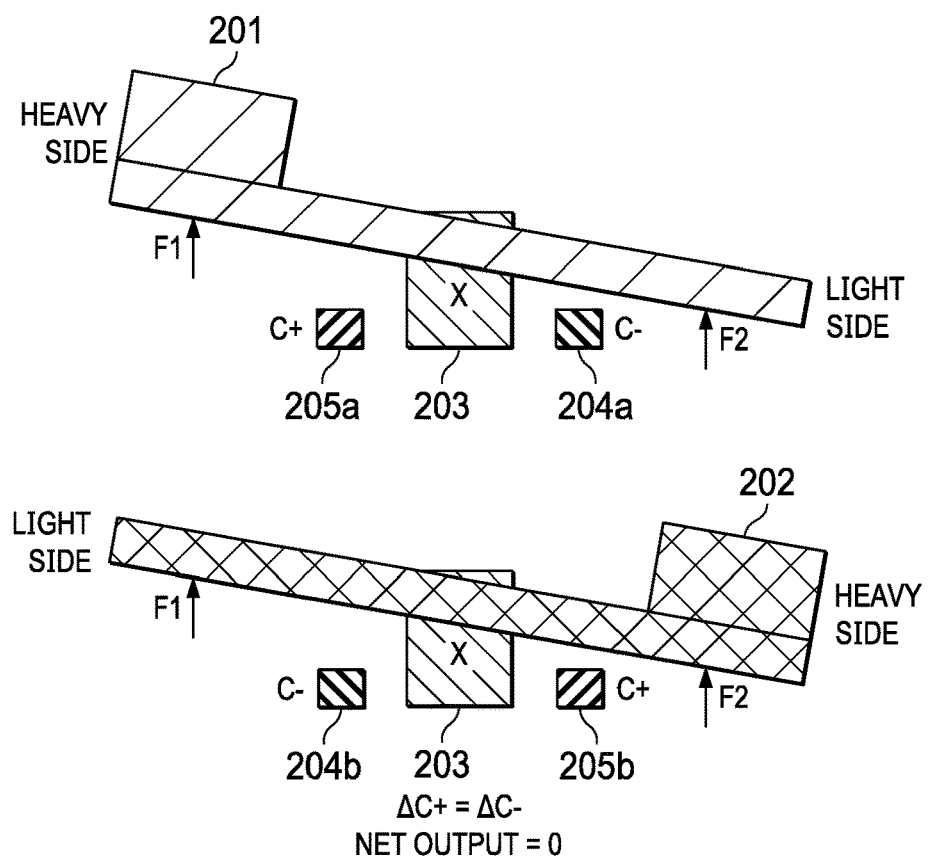
FIG. 3B is a side view of dual pendulous proof masses illustrating common mode rejection of forces caused by a lateral thermal gradient, according to an embodiment.

FIG. 3B is a side view of dual pendulous proof masses illustrating common mode rejection of lateral pressure force components F1, F2, caused by a lateral thermal gradient, according to an embodiment. When subjected to a lateral thermal gradient, pendulous mass 201 pivots about anchor 203 in the clockwise direction causing mass 201 (a moving common electrode) to move closer to positive fixed electrode 205a and further from negative fixed electrode 204a. Under the same lateral thermal gradient, pendulous mass 202 pivots about anchor 203 in the same clockwise direction causing mass 202 (a moving common electrode) to move away from positive fixed electrode 204b and towards negative fixed electrode 205b. This pivoting results in a net output of zero (ΔC+=ΔC−). Accordingly, dual pendulous proof masses that include a number and size of perforations adjusted to achieve symmetric areas in order to achieve a zero net torque, suppress offset caused by both vertical and lateral thermal gradients.

Figure 4:
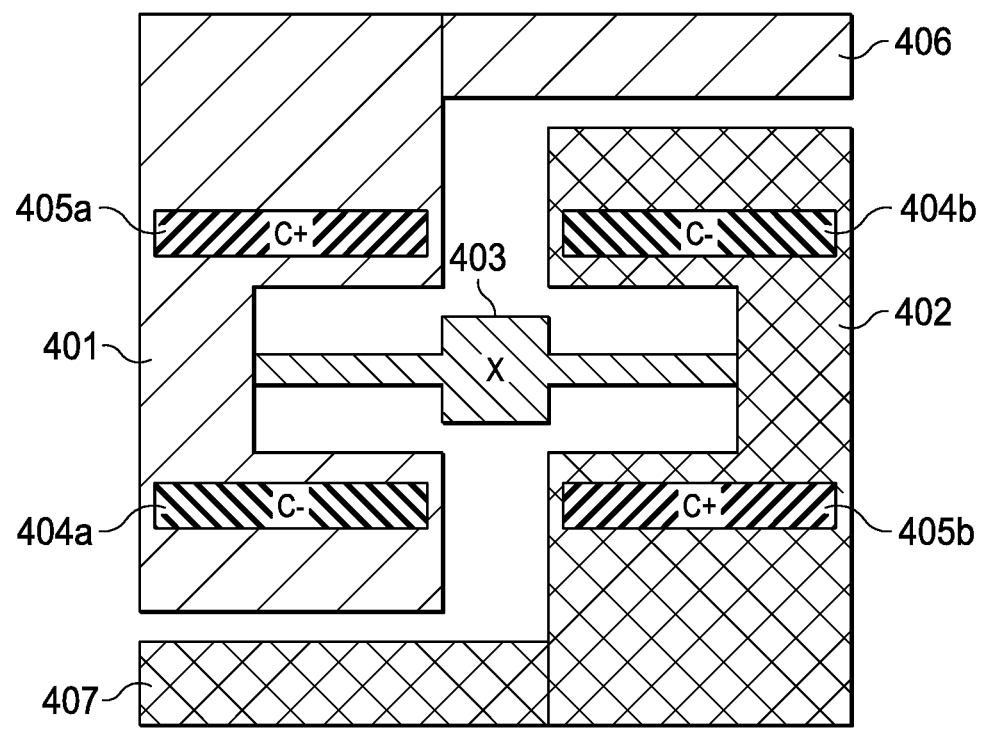
FIG. 4 is a top view of an alternative design using asymmetric, dual pendulous proof masses, according to an embodiment.

FIG. 4 is a top view of an alternative design of dual pendulous masses with asymmetric masses, according to an embodiment. A first pendulous mass 401 and a second pendulous mass 402 are rotatably coupled to anchor 403 by, for example, torsion bars. Pendulous mass 401 includes finger portion 406, which overhangs pendulous mass 402. Electrodes 404a (C−) and 405a (C+) are disposed on, or formed in, a substrate supporting pendulous mass 401. Pendulous mass 402 includes finger portion 407, which overhangs pendulous mass 401. Electrodes 404b (C−) and 405b (C+) are disposed on, or formed in, the substrate. This alternative design allows for a stiffer suspension, which makes it less susceptible to stiction.

Figure 5:
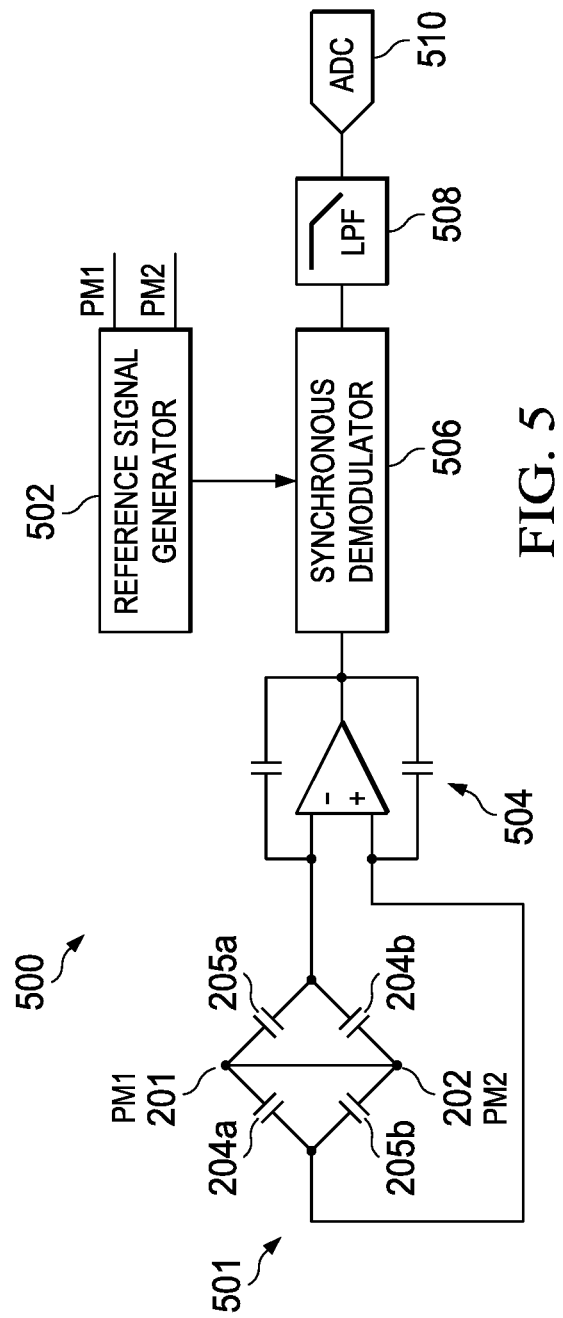
FIG. 5 is a diagram of an interface circuit for processing capacitance change extracted from a capacitive MEMS accelerometer with dual pendulous proof masses, according to an embodiment.

FIG. 5 is a flow diagram illustrating a readout circuit for a differential capacitance MEMS accelerometer, according to an embodiment. Readout circuit 500 implements a synchronous demodulation technique to reduce noise, increase linearity and dynamic range. In an embodiment, readout circuit 500 includes differential capacitors 501 (electrodes 204a, 204b, 205a, 205b), reference signal generator 502, amplifier 504, synchronous demodulator 506, low-pass filter 508 and analog-to-digital converter (ADC) 510. The reference signals (PM1, PM2) can be AC voltage signals that can be a square-wave or sinusoidal signal. The reference signals PM1 and PM2 are applied onto pendulous proof masses 201, 202, respectively where the masses form differential capacitive pairs with sensing electrodes 204a, 204b, 205a, 205b. Amplifier 504 is used to convert the differential sensing capacitance value to an amplified AC voltage and can be, for example, a trans-impedance amplifier. The amplified AC voltage is input into synchronous demodulator 506, which operates at the excitation frequency $f_e$ and is controlled by control signal $X_c(t)$. The output voltage of synchronous demodulator 506, $V_{out}$ is proportional to the product of the differential capacitance ($C_+ - C_-$) and feedback capacitor $C_f$ of amplifier 504, according to Equation [20]:

$$V_{out} \propto \frac{1}{C_f}(C_+ - C_-) \quad [20]$$

The output voltage, $V_{out}$, of synchronous demodulator 506 is input into low-pass filter 508, which outputs a DC output signal with an amplitude and phase corresponding to the sensed capacitance change. Low-pass filter 508 (e.g., a Bessel filter) limits the bandwidth, and thus increases the resolution of the voltage signal. ADC 510 converts the filtered DC output signal into a digital value, which can be used by various applications, as described in reference to FIG. 6. ADC converter 510 can be implement using, for example, a delta-sigma ADC. In an embodiment, a feedback can be included to increase the dynamic range of circuit 500.

FIG. 6 is an architecture for an electronic system that uses the capacitive MEMS accelerometer with dual pendulous masses for various applications, according to an embodiment. Architecture 600 can be included in any electronic device that uses motion sensors, including but not limited to: smart phones, tablet computers, wearable devices (e.g., a smart watch) and automotive systems.

Architecture 600 includes processor(s), memory interface 602, peripherals interface 603, motion sensors 604a . . . 604n, display device 605 (e.g., touch screen, LCD display, LED display), I/O interface 606 and input devices 607 (e.g., touch surface/screen, hardware buttons/switches/wheels, virtual or hardware keyboard, mouse). Memory 612 can include high-speed random access memory and/or non-volatile memory, such as one or more magnetic disk storage devices, one or more optical storage devices and/or flash memory (e.g., NAND, NOR).

Memory 612 stores operating system instructions 608, sensor processing instructions 609 and application instructions 610. Operating system instructions 608 include instructions for implementing an operating system on the device, such as iOS, Darwin, RTXC, LINUX, UNIX, WINDOWS, or an embedded operating system such as VxWorks. Operating system instructions 608 may include instructions for handling basic system services and for performing hardware dependent tasks. Sensor-processing instructions 609 perform post-processing on motion sensor data (e.g., averaging) and provide control signals to motion sensors. Application instructions 610 implement software programs that use data from one or more motion sensors 604a . . . 604n, such as navigation, digital pedometer, tracking or map applications. At least one motion sensor 604a is the capacitive MEMS accelerometer with dual pendulous masses, as described in reference to FIGS. 1-5.

For example, in a navigation application executed on a smart phone, acceleration data is provided by the capacitive MEMS accelerometer to processor(s) 601 through peripheral interface 603. Processor(s) 601 execute sensor-processing instructions 609, to perform further processing of the acceleration data (e.g., averaging). Processor(s) 601 execute instructions for the navigation application, which draws a map on display device 605 including a location marker that shows the location of the smartphone on the map. The acceleration data is used to determine the speed and direction of the smart phone on the map. If a user is walking with the smartphone, the acceleration data can be used to count steps using known digital pedometer techniques. The step count can be multiplied by the user's stride length to determine a distance traveled by the user. Accordingly, the applications benefit from the dual pendulous design in that the acceleration measurements provided by the capacitive MEMS accelerometer are more accurate than without the design due to the common mode rejection of vertical and lateral thermal gradient-induced offset.

While this document contains many specific implementation details, these should not be construed as limitations on the scope what may be claimed, but rather as descriptions of features that may be specific to particular embodiments. Certain features that are described in this specification in the context of separate embodiments can also be implemented in combination in a single embodiment. Conversely, various features that are described in the context of a single embodiment can also be implemented in multiple embodiments separately or in any suitable sub combination. Moreover, although features may be described above as acting in certain combinations and even initially claimed as such, one or more features from a claimed combination can, in some cases, be excised from the combination, and the claimed combination may be directed to a sub combination or variation of a sub combination. Logic flows depicted in the figures do not require the particular order shown, or sequential order, to achieve desirable results. In addition, other steps may be provided, or steps may be eliminated, from the described flows, and other components may be added to, or removed from, the described systems. Accordingly, other implementations are within the scope of the following claims.

What is claimed is:

1. A micro-electromechanical systems (MEMS) sensor, comprising:
a substrate;
a first electrode and a second electrode disposed on, or formed in, the substrate, the first electrode and the second electrode having a first polarity;
a third electrode and a fourth electrode disposed on, or formed in the substrate, the third electrode and the fourth electrode having a second polarity opposite the first polarity;
an anchor disposed on the substrate;
a first pendulous mass having a first surface area, the first pendulous mass rotatably coupled to the anchor and having a heavy side and a light side, the heavy side of the first pendulous mass having more mass then the light side of the first pendulous mass, the heavy side mass extending perpendicular to the first surface area to suppress, thermal gradient-induced offset, the first pendulous mass serving as a first common electrode and positioned to form a first gap between the first electrode and the first pendulous mass and a second gap between the second electrode and the first pendulous mass, the first pendulous mass configured to rotate about the anchor in a first direction when the first pendulous mass is subjected to an acceleration force; and
a second pendulous mass having a second surface area, the second pendulous mass rotatably coupled to the anchor and having a heavy side and a light side, the heavy side of the second pendulous mass having more mass then the light side of the second pendulous mass, the heavy side mass extending perpendicular to the second surface area to suppress the thermal gradient-induced offset, the heavy side of the second pendulous mass laterally adjacent to the light side of the first pendulous mass, the second pendulous mass serving as a second common electrode and positioned to form a third gap between the third electrode and the second pendulous mass and a fourth gap between the fourth electrode and the second pendulous mass, the second pendulous mass configured to rotate about the anchor in a second direction that is opposite the first direction when the second pendulous mass is subjected to the acceleration force.

2. The MEMS sensor of claim 1, further comprising:
a readout circuit configured to:
convert a change in differential capacitance between the first and the third electrodes and the second electrode and the fourth electrodes to differential voltage signals, the change in capacitance caused by a change in the first, second, third and fourth gaps in response to the acceleration force; and
process the differential voltage signals to remove lateral, thermal gradient-induced offset.

3. The MEMS sensor of claim 1, wherein at least one of the first or second pendulous masses is fabricated using multiple layers of polysilicon that include a plurality of perforations to reduce vertical, thermal gradient-induced offset.

4. The MEMS sensor of claim 3, wherein the perforations include a hole quantity and a hole size selected to suppress vertical, thermal gradient-induced offset.

5. The MEMS sensor of claim 1, wherein the first and the second pendulous masses are rotatably coupled to the anchor with torsion bars.

6. The MEMS sensor of claim 1, wherein the first and the second pendulous masses are asymmetric.

7. An electronic system comprising:
a micro-electromechanical systems (MEMS) sensor configured to sense acceleration of the electronic system, the MEMS sensor including dual pendulous masses, each pendulous mass having a surface area and a light side and a heavy side, the heavy side of each pendulous mass extending perpendicular to its respective surface area to suppress thermal gradient-induced offset, the heavy side of each pendulous mass laterally adjacent to the light side of the other pendulous mass, and a readout circuit configured to:
convert a change in differential capacitance between electrodes of the MEMS sensor to differential voltage signals;
process the differential voltage signals to remove lateral, thermal gradient-induced offset; and
calculate acceleration data based on the processed differential voltage signals;
one or more processors;
memory coupled to the one or more processors and storing instructions that when executed by the one or more processors, cause the one or more processors to perform operations comprising:
obtaining the acceleration data;
calculating a location of the electronic system using the acceleration data; and
displaying the location on a display device of the electronic system.

8. The electronic system of claim 7, wherein the MEMS sensor further comprises:
a substrate;
a first electrode and a second electrode disposed on, or formed in, the substrate, the first electrode and the second electrode having a first polarity;
a third electrode and a fourth electrode disposed on, or formed in the substrate, the first electrode and the second electrode having a first polarity;
an anchor disposed on the substrate;
a first pendulous mass rotatably coupled to the anchor, the first pendulous mass serving as a first common electrode and positioned to form a first gap between the first electrode and the first pendulous mass and a second gap between the second electrode and the first pendulous mass, the first pendulous mass configured to rotate about the anchor in a first direction when the first pendulous mass is subjected to an acceleration force; and a second pendulous mass rotatably coupled to the anchor, the second pendulous mass serving as a second common electrode and positioned to form a third gap between the third electrode and the second pendulous mass and a fourth gap between the fourth electrode and the second pendulous mass, the second pendulous mass configured to rotate about the anchor in a second direction that is opposite the first direction when the second pendulous mass is subjected to the acceleration force.

9. The electronic system of claim 8, wherein at least one of the first or second pendulous mass is fabricated using multiple layers of polysilicon that include a plurality of perforations to reduce vertical, thermal gradient-induced offset.

10. The electronic system of claim 9, wherein the perforations include a hole quantity and a hole size selected to suppress vertical, thermal gradient-induced offset.

11. The electronic system of claim 8, wherein the first and the second pendulous masses are rotatably coupled to the anchor with torsion bars.

12. The electronic system of claim 8, wherein the first and the second pendulous masses are asymmetric.

* * * * *